(12) United States Patent
Goldberger et al.

(10) Patent No.: US 7,426,102 B2
(45) Date of Patent: Sep. 16, 2008

(54) HIGH PRECISION CAPACITOR WITH STANDOFF

(75) Inventors: Haim Goldberger, Modi'in (IL); Reuven Katraro, Rishon Lezion (IL); Doron Gozaly, Bat-Yam (IL)

(73) Assignee: Vishay Intertechnology, Inc., Malvern, PA (US)

( * ) Notice: Subject to any disclaimer, the term of this patent is extended or adjusted under 35 U.S.C. 154(b) by 311 days.

(21) Appl. No.: 11/415,039

(22) Filed: May 1, 2006

(65) Prior Publication Data

US 2007/0253143 A1    Nov. 1, 2007

(51) Int. Cl.
*H01G 4/228* (2006.01)
(52) U.S. Cl. .............. 361/306.1; 361/306.3; 361/321.1; 361/321.2; 361/313; 361/303
(58) Field of Classification Search .............. 361/306.1, 361/306.2, 306.3, 301.1, 301.2, 311–313, 361/302–305; 257/532–535, 555–556
See application file for complete search history.

(56) References Cited

U.S. PATENT DOCUMENTS

| | | | | |
|---|---|---|---|---|
| 5,563,762 | A * | 10/1996 | Leung et al. | 361/301.4 |
| 6,226,170 | B1 * | 5/2001 | Nellissen et al. | 361/306.1 |
| 6,243,253 | B1 * | 6/2001 | DuPre et al. | 361/306.3 |
| 6,407,907 | B1 * | 6/2002 | Ahiko et al. | 361/306.3 |
| 6,538,300 | B1 | 3/2003 | Goldberger et al. | |
| 6,606,237 | B1 * | 8/2003 | Naito et al. | 361/306.3 |
| 6,621,142 | B2 | 9/2003 | Goldberger et al. | |
| 6,621,143 | B2 | 9/2003 | Goldberger et al. | |
| 6,727,140 | B2 * | 4/2004 | Basceri et al. | 438/240 |
| 6,800,921 | B1 * | 10/2004 | Coolbaugh et al. | 257/532 |
| 6,888,716 | B2 * | 5/2005 | List et al. | 361/306.2 |

FOREIGN PATENT DOCUMENTS

| | | |
|---|---|---|
| JP | 63 013337 A | 1/1988 |
| JP | 02 260620 A | 10/1990 |
| JP | 2000 323523 A | 11/2000 |
| WO | WO 2004/086432 A1 | 10/2004 |

OTHER PUBLICATIONS

PCT/US2006/032304 International Search Report, Vishay Intertechnology, Inc., Aug. 18, 2006.

* cited by examiner

*Primary Examiner*—Nguyen T Ha
(74) *Attorney, Agent, or Firm*—McKee, Voorhees & Sease, P.L.C.

(57) ABSTRACT

An electronic component such as a capacitor includes a substrate having first and second principal surfaces, a dielectric layer overlaying the first principal surface of the substrate, a first electrode, and a second electrode. There is a passivation layer overlaying the first and second electrodes, a first opening being formed in the passivation layer over the first electrode and a second opening being formed in the passivation layer over the second electrode. A first bottom electrode termination is positioned in the first opening and a second bottom electrode termination is positioned in the second opening. The first bottom electrode termination is electrically connected to the first electrode and the second bottom electrode termination is electrically connected to the second electrode. A standoff is positioned between the first bottom electrode termination and the second bottom electrode termination and attached to the passivation layer to thereby provide support for the electronic component when mounted. The standoff provides resistance to tilting.

22 Claims, 8 Drawing Sheets

HIGH PRECISION CAPACITOR WITH STANDOFF

BACKGROUND OF THE INVENTION

This invention relates to electronic component packaging of bottom electrode devices. This includes, but is not limited to the formation of a high-frequency capacitor on a semiconductor substrate which is packaged to reduce tilting of the device.

Higher frequencies are increasingly being used in communications technology. For example, frequencies in the range of 450 MHz to 3 GHz are used in cellular communications and frequencies in the range of 10 GHz to 18 GHz are used in satellite video and data transmission. These applications require small, precise capacitors. Multi-layer ceramic capacitors have been employed for this purpose, but they tend to be lacking in precision and performance. Thin film capacitors have improved precision and performance but they are expensive.

U.S. Pat. No. 6,621,143 to Goldberger et al. discloses a precision high frequency capacitor on a semiconductor substrate. U.S. Pat. No. 6,538,300 to Goldberger et al. similarly discloses a precision high frequency capacitor on a semiconductor substrate. U.S. Pat. No. 6,621,143 to Goldberger et al. similarly discloses a precision high frequency capacitor on a semiconductor substrate. All of these references are herein incorporated by reference in their entireties. The capacitors of these references are precision high-frequency capacitor that can be manufactured at a reasonable cost. However, problems remain with capacitors of this variety. In particularly, the shape of the terminations used in such devices are susceptible to tilting. The terminations used can be solder balls which are integrated into the device and are electrically connected to terminals within the device. The termination may also be formed by screen printing. What is needed is a high-precision capacitor (HPC) device which is resistant to tilting.

BRIEF SUMMARY OF THE INVENTION

Therefore, it is a primary object, feature, or advantage of the present invention to improve upon the state of the art.

It is a further object, feature, or advantage of the present invention to provide a high-precision capacitor which is resistant to device tilting.

Yet another object, feature, or advantage of the present invention is to provide a high-precision capacitor which is convenient and/or cost effective to manufacture.

A further object, feature, or advantage of the present invention is to provide an electronic component which uses bottom electrodes as terminations yet is resistant to tilting.

One or more of these and/or other objects, features, or advantages of the present invention will be apparent from the specification and claims that follow.

The present invention provides for use of a standoff to reduce tilting of a device which incorporates bottom electrodes as terminations. The bottom electrodes can be formed by solder balls, screen printing or other known techniques. According to one aspect of the present invention, a capacitor includes a substrate having first and second principal surfaces, a dielectric layer overlaying the first principal surface of the substrate, a first electrode, and a second electrode. There is a passivation layer overlaying the first and second electrodes, a first opening being formed in the passivation layer over the first electrode and a second opening being formed in the passivation layer over the second electrode. A first bottom electrode termination is positioned in the first opening and a second bottom electrode termination is positioned in the second opening. The first bottom electrode termination is electrically connected to the first electrode and the second bottom electrode termination is electrically connected to the second electrode. A standoff is positioned between the first bottom electrode termination and the second bottom electrode termination and attached to the passivation layer to thereby provide support for the capacitor when mounted. The standoff provides resistance to tilting.

The standoff may be configured as a strip. Where configured as a strip, preferably the strip fully extends across the capacitor. Alternatively, the standoff may be configured as a dot or a partial dot or other shape. The capacitor can be of various types and sizes. For example, the capacitor can be packaged in a standard 0402 size package having a length of about 0.04 inches (1.02 mm) and a width of about 0.02 inches (0.51 mm). The standoff can be of various sizes including within the range of 100 to 400 μm in width. The standoff is preferably between 50 and 200 μm thick but this width can vary based on the thickness of the termination.

According to another aspect of the present invention, an electronic component is provided. The electronic component includes a substrate having first and second opposite principal surfaces, a first electrode overlaying the substrate, and a second electrode overlaying the substrate. There is a passivation layer overlaying the first and second electrodes. A first opening is formed in the passivation layer over the first electrode and a second opening is formed in the passivation layer over the second electrode. A first bottom electrode termination is electrically connected to the first electrode and the first bottom electrode termination extends beyond the first surface of the semiconductor substrate. A second bottom electrode termination is electrically connected to the second electrode and extends beyond the first surface of the semiconductor substrate. There is a standoff positioned between the first bottom electrode termination and the second bottom electrode termination which extends beyond the first surface of the semiconductor substrate to thereby provide support for the electronic component when mounted to thereby provide resistance to tilting of the electronic component. The first and second bottom electrode terminations may be formed using solder balls, screen printing, or otherwise. The electronic component may be a capacitor or other type of component.

BRIEF DESCRIPTION OF THE DRAWINGS

This invention will be best understood by reference to the following drawings, in which like components have the same reference numeral. The drawings are not necessarily drawn to scale.

DETAILED DESCRIPTION OF THE PREFERRED EMBODIMENT

The present invention provides for a standoff for use with devices such as high precision capacitors which have terminations formed by bottom electrodes such as may be formed by solder balls, screen printing or otherwise. Capacitors with bottom electrode terminations are disclosed in U.S. Pat. No. 6,621,143 to Goldberger et al., U.S. Pat. No. 6,538,300 to Goldberger et al., and U.S. Pat. No. 6,621,143 to Goldberger, all of which are hereby incorporated by reference in their entirety.

Figure 1:
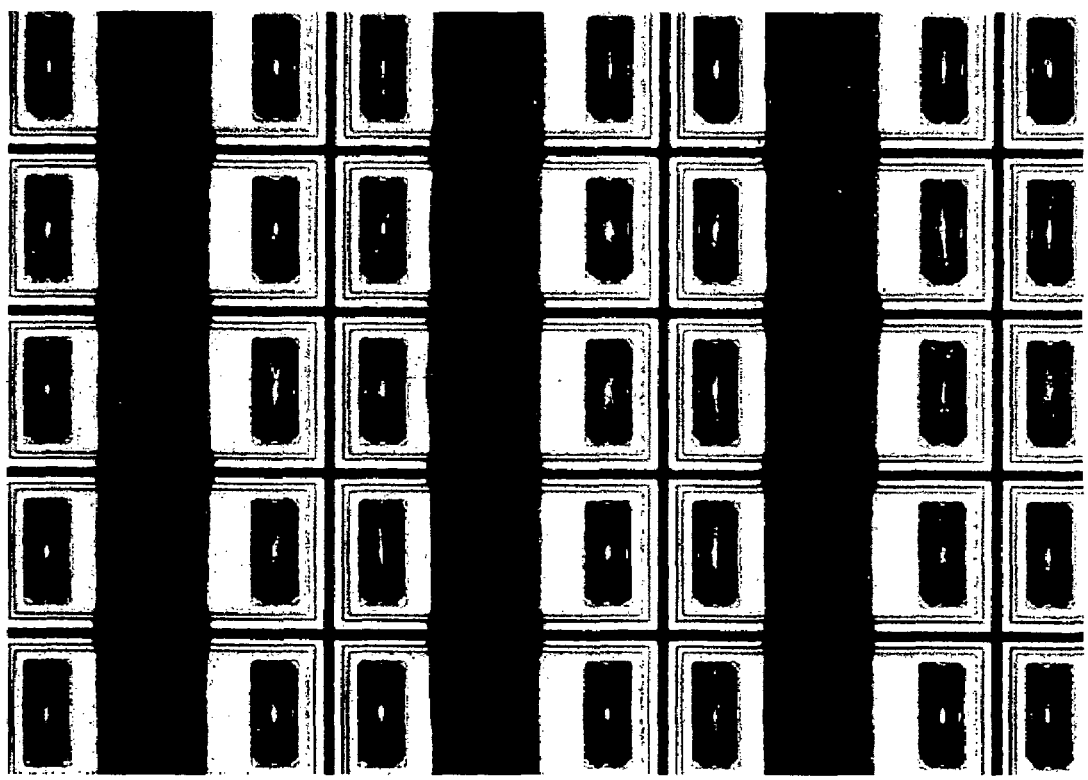
FIG. 1 is photograph showing a plurality of components with a standoff of the present invention prior to singulation of the components.

FIG. 1 is a photograph showing a plurality of capacitors with standoffs formed on a single wafer. The large dark strips shown are the standoffs. Following fabrication of the capacitors, the die which contains each capacitor is separated from others in the wafer by sawing the wafer along scribe lines or otherwise.

Figure 2:
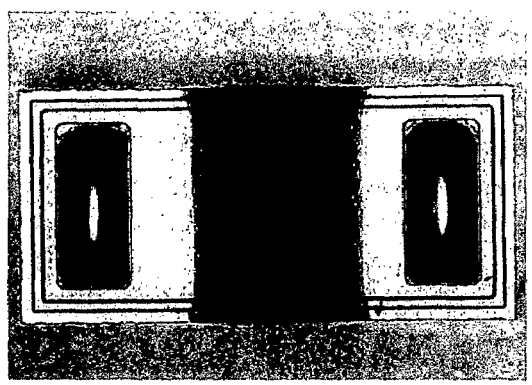
FIG. 2 is a photograph showing a bottom view of one embodiment of a capacitor of the present invention, the capacitor having a centrally located standoff.

FIG. 2 is a photograph of a high precision capacitor of the present invention with a standoff. The bottom portion of the capacitor is shown with opposite terminals for connection to a circuit board and a standoff positioned between the terminals.

Figure 3:
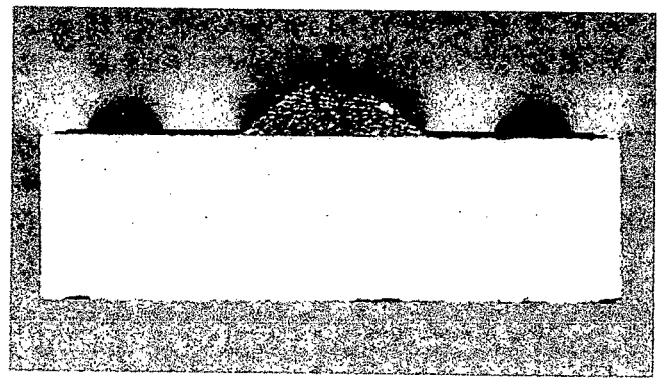
FIG. 3 is a photograph showing a cross-section of one embodiment of a capacitor of the present invention.

FIG. 3 is a photograph of a cross-section of a high precision capacitor of the present invention.

Figure 4:
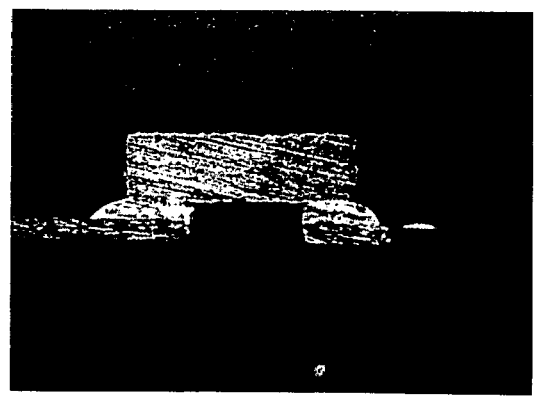
FIG. 4 is a photograph showing a profile of one embodiment of a capacitor of the present invention, the capacitor mounted to a circuit board.

FIG. 4 is a photograph of a profile of a high precision capacitor of the present invention connected to a circuit board.

Figure 5A:
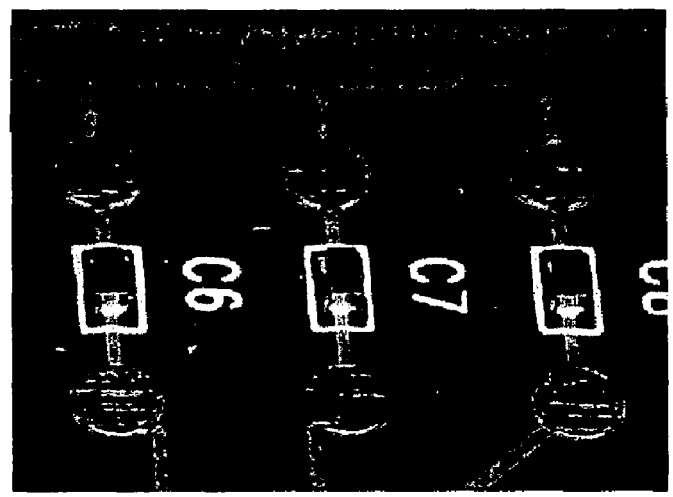
FIG. 5A is a photograph of one embodiment of capacitors of the present invention connected to a circuit board.
Figure 5B:
FIG. 5B is a photograph showing one of the capacitors of FIG. 5A in greater detail.
Figure 6A:
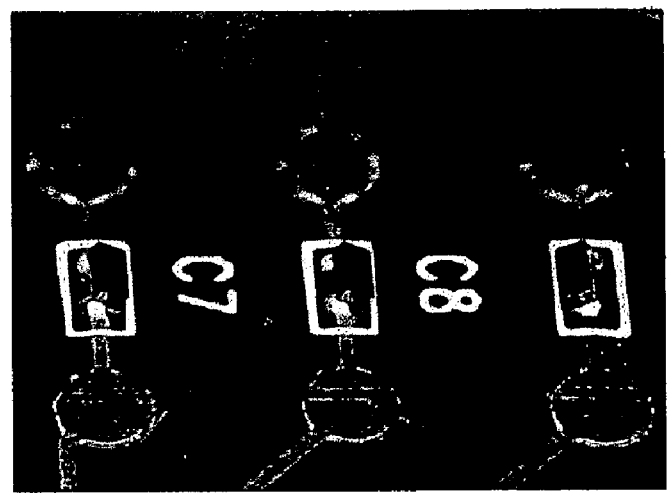
FIG. 6A is a photograph of prior art capacitors connected to a circuit board.
Figure 6B:
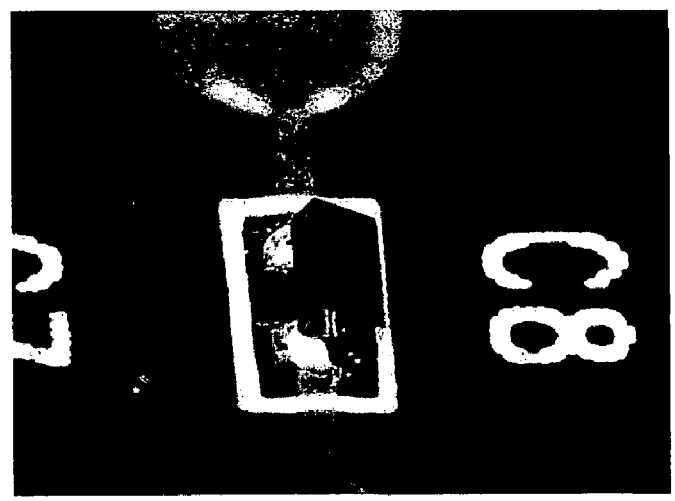
FIG. 6B is a photograph showing one of the prior art capacitors of FIG. 6A in greater detail.

FIGS. 5A and 5B are photographs illustrating a high precision capacitor of the present invention connected to a circuit board. Compare FIGS. 5A and 5B with FIGS. 6A and 6B. The prior art devices of FIG. 6A and 6B are substantially tilted to the side. Thus, the side-to-side tilting of the device can be a significant issue. Note that the devices of the present invention as shown in FIG. 5A-5B are not tilted to either side and therefore avoid the problems of the prior art devices.

Figure 7:
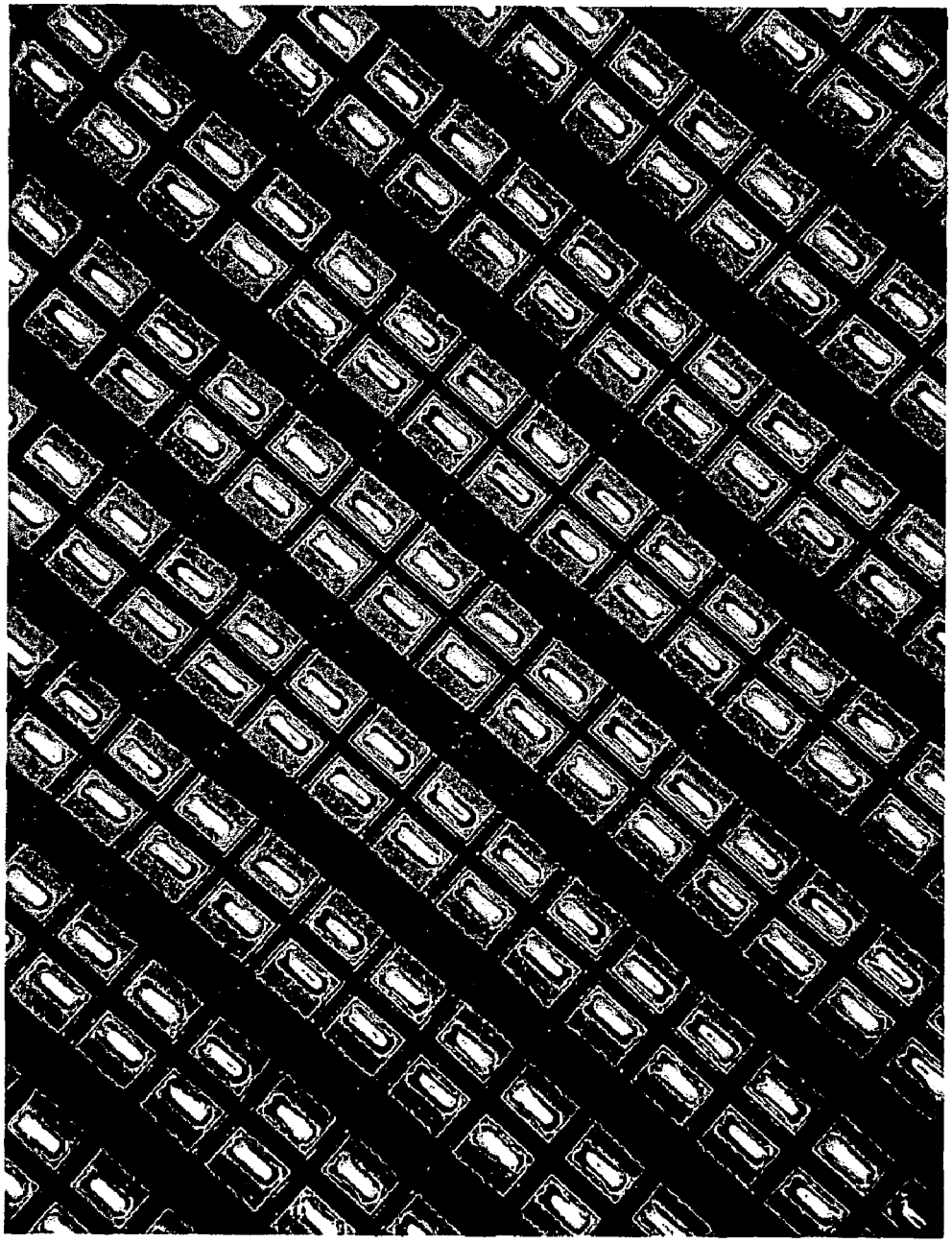
FIG. 7 illustrates a plurality of components during the manufacturing process and prior to singulation.

FIG. 7 illustrates a wafer having a plurality of components of the present invention placed on the wafer. Strips of standoff material are shown applied to the capacitors. The strips are applied to traverse each capacitor in a central location between opposite terminals. The standoff material strip shown is preferably approximately 100 to 400 µm wide. The thickness is preferably 50 to 200 µm thick, although other dimensions may be appropriate depending upon the thickness of the termination. The shape of the stand-off can be a strip (as shown) or can be of other shapes, including dots, partial dots and strips. The present invention contemplates that the stand-off material may be of various types or compositions. One example of such a material is a polymer SN7 adhesive.

Figure 8A:
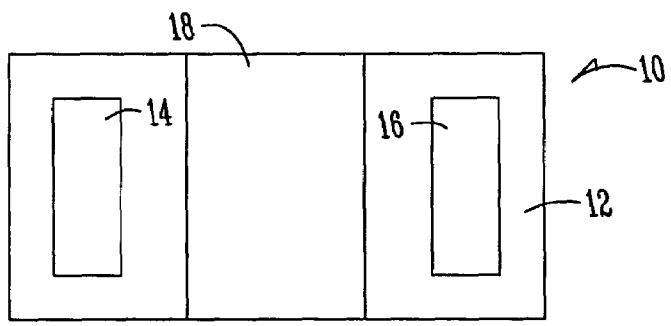
FIG. 8A illustrates a bottom view of one embodiment of a capacitor with a standoff shaped as a strip according to the present invention.
Figure 9:
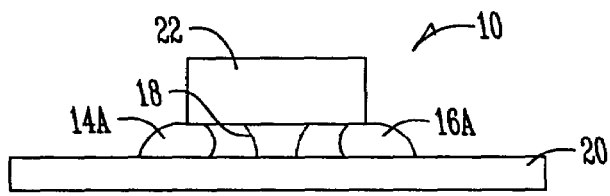
FIG. 9 illustrates a side view of one embodiment of a capacitor with a standoff according to the present invention, the capacitor connected to a circuit board.
Figure 8B:
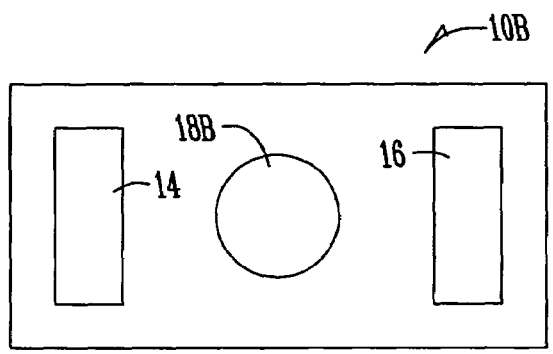
FIG. 8B illustrates a bottom view of another embodiment of a capacitor of the present invention with a standoff shaped as a dot.
Figure 8C:
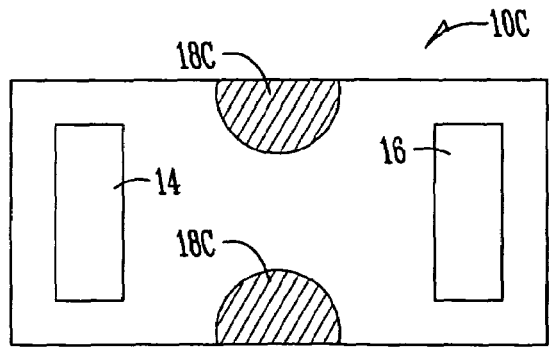
FIG. 8C illustrates a bottom view of another embodiment of a capacitor of the present invention with a standoff shaped as a partial dot.

FIG. 8A illustrates a bottom view of one embodiment of a capacitor of the present invention. As shown in FIG. 8A, a surface mount capacitor 10 has a surface mount capacitor body 12. A first termination 14 is shown and second termination 16 is shown on a surface of the body. Between the first termination 14 and the second termination 16 is a standoff 18. The standoff 18 shown is a strip. Where the standoff is a strip, the strip need not fully extend from side-to-side. Alternatively, as shown in FIG. 8B, the standoff can be a dot 18B as in the device 10B. Alternatively, as shown in FIG. 8C, the standoff can be a partial dot 18C as shown for the device 10C. Thus, the present invention contemplates variations in the size and shape of the standoff. It is to be understood that the strip 18 shown in FIG. 8A is preferred because it improves the convenience of the manufacturing process where multiple devices are made at the same time while also increasing the surface area of the capacitor which is in contact with the standoff.

Figure 10:
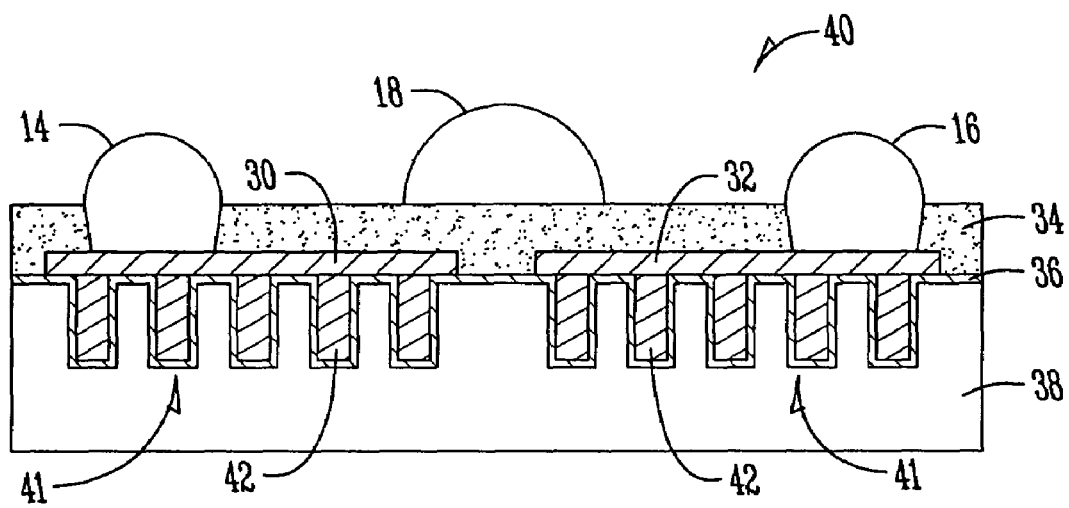
FIG. 10 illustrates a cross-sectional view of one embodiment of a capacitor of the present invention.

FIG. 10 illustrates a profile view of a capacitor 10D. The capacitor 10D has a capacitor body 22 with bottom electrodes terminals 14A and 16A attached to a bottom surface of the capacitor body 22 as terminations. The terminals 14A and 16A electrically connect the capacitor 10D to a circuit board 20. The bottom electrode terminals 14A and 16A are terminals of the circuit board and solder formed by screen printing. The standoff 18 shown mechanically connects the capacitor 10D to the circuit board 20 to provide additional stability and support and thereby avoid tilting of the capacitor 10D.

FIG. 10 shows a cross-sectional view of an alternative embodiment. The capacitor 40 of FIG. 10 uses trenches 41 under electrodes 30 and 32. A dielectric layer 36 extends into trenches 41 and lines the walls thereof in the manner of a normal trench-gated MOSFET. The trenches 41 are filled with a conductive material 42, such as polysilicon, which is in electrical contact with electrodes 30 and 32. The net result is to increase the effective area of the interface between the "plates" and the dielectric layer of the capacitor.

Figure 11:
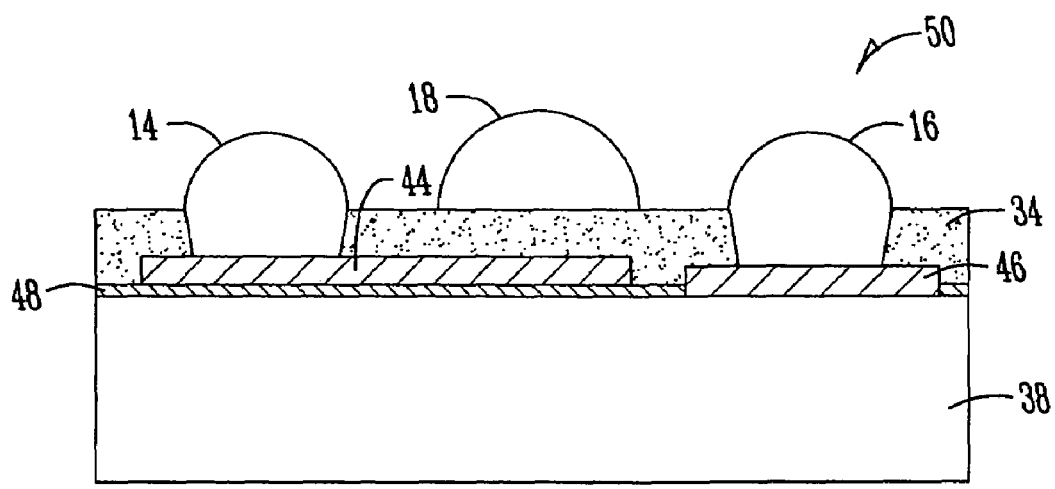
FIG. 11 illustrates a cross-sectional view of another embodiment of a capacitor of the present invention.

FIG. 11 shows a cross-sectional view of another embodiment. In FIG. 1, the electrode 46 is in electrical contact with the substrate 38. The electrode 44 is separated from the substrate 38 by a dielectric layer 48 having a defined thickness. The lateral placement of electrodes 44 and 46 leads to a larger effective series resistance (ESR) which is a function of the lateral dimension of the device without significant effect on the capacitance value per unit area.

Figure 12:
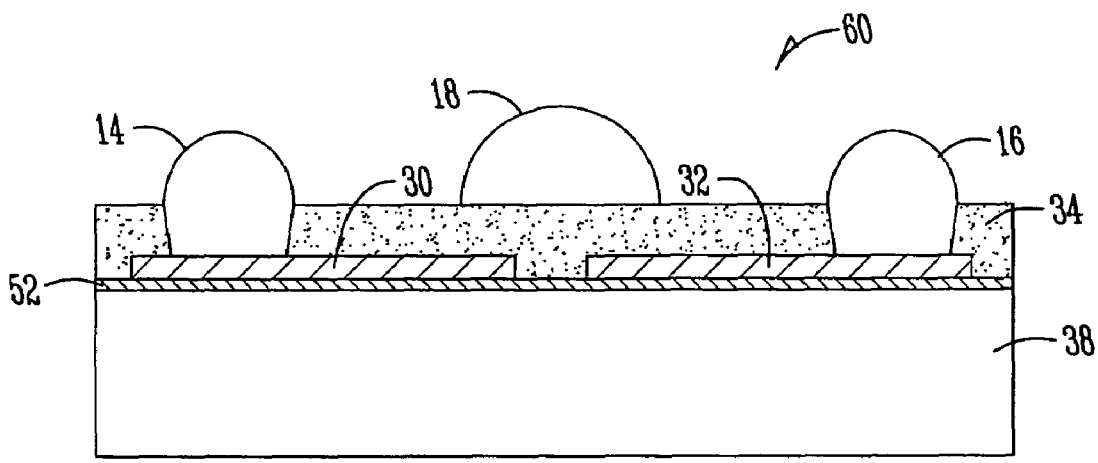
FIG. 12 illustrates a cross-sectional view of yet another embodiment of a capacitor of the present invention.

FIG. 12 shows a cross-sectional view of an alternative embodiment. Capacitor 60 is actually a pair of capacitors connected in series. A dielectric layer 52 is formed on N+ silicon substrate 38. A metal layer is deposited on dielectric layer 52 and is patterned, using normal photolithographic processes, to form a first electrode 30 and a second electrode 32. A passivation layer 34 is deposited on the top surface of the structure. Openings are formed in passivation layer 34, and bottom electrodes such as solder balls 14 and 16 are formed as described above. A standoff 18 is formed over the passivation layer 32 above the surface of the substrate 38.

Figure 13:
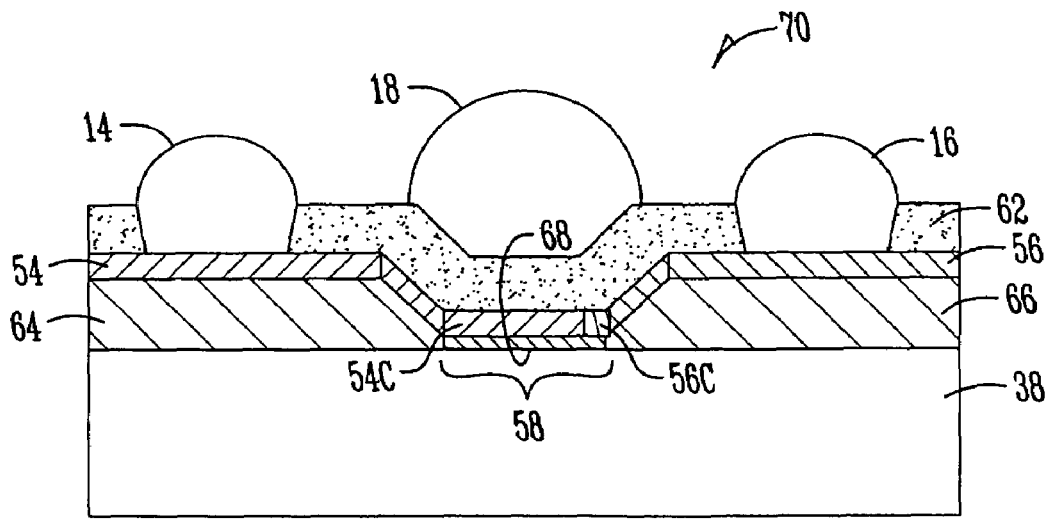
FIG. 13 illustrates a cross-sectional view of a still further embodiment of a capacitor of the present invention.

FIG. 13 is a cross section of another embodiment of a capacitor of the present invention. A first electrode 54 has fingers 54a-54c that are interdigitated with fingers 56a-56d of the second electrode 56. In an active region 58, where the fingers are interdigitated, a thin dielectric layer 68 is formed over the substrate. A relatively thick dielectric layer 64 separates the remaining "palm" portion of electrode 54 from the N+ substrate 38, and a relatively thick dielectric layer 66 separates the palm portion of electrode 56 from substrate 38. The capacitance of capacitor 70 is determined by the number and dimensions of the fingers. A standoff 18 is shown which extends above the passivation layer.

Therefore, various capacitors having the standoff of the present invention have been described. The present invention is not to be limited to the specific embodiments disclosed herein. The present invention contemplates variations in the size and shape of the standoff, the material used for the standoff, the package size of the electronic component, and other variations. It also should be appreciated that although the present invention is described in terms of a capacitor, it can include other types of electronic components which have bottom electrodes as terminations.

What is claimed is:

1. A capacitor, comprising:
    a semiconductor substrate having first and second principal surfaces;
    a dielectric layer overlaying the first principal surface of the substrate;
    a first electrode;
    a second electrode;
    a passivation layer overlying the first and second electrodes, a first opening being formed in the passivation layer over the first electrode and a second opening being formed in the passivation layer over the second electrode;
    a first bottom electrode termination in the first opening and a second bottom electrode termination in the second opening, the first bottom electrode termination being electrically connected to the first electrode and the second bottom electrode termination being electrically connected to the second electrode;
    a standoff positioned between the first bottom electrode termination and the second bottom electrode termination and attached to the passivation layer to thereby provide support for the capacitor when mounted to thereby provide resistance to tilting.

2. The capacitor of claim 1 wherein the standoff is configured as a strip.

3. The capacitor of claim 2 wherein the strip fully extends across the capacitor.

4. The capacitor of claim 1 wherein the standoff is configured as a dot.

5. The capacitor of claim 1 wherein the standoff is configured as a partial dot.

6. The capacitor of claim 1 wherein the capacitor is packaged in a standard 0402 size having a length of about 0.04 inches (1.02 mm) and a width of about 0.02 inches (0.51 mm).

7. The capacitor of claim 1 wherein the standoff is between 100 and 400 μm wide.

8. The capacitor of claim 1 wherein the standoff is between 50 and 200 μm thick.

9. The capacitor of claim 1 wherein the first bottom electrode termination comprises a first solder ball and the second bottom electrode termination comprises a second solder ball.

10. The capacitor of claim 1 wherein the first bottom electrode termination and the second bottom electrode termination being screen printed.

11. An electronic component, comprising:
    a substrate having first and second opposite principal surfaces;
    a first electrode overlaying the substrate;
    a second electrode overlaying the substrate;
    a passivation layer overlaying the first and second electrodes, a first opening being formed in the passivation layer over the first electrode and a second opening being formed in the passivation layer over the second electrode;
    a first bottom electrode termination electrically connected to the first electrode and extending beyond the first surface of the substrate;
    a second bottom electrode termination electrically connected to the second electrode and extending beyond the first surface of the substrate;
    a standoff positioned between the first bottom electrode termination and the second bottom electrode termination and extending beyond the first surface of the substrate to thereby provide support for the electronic component when mounted to thereby provide resistance to tilting of the electronic component.

12. The electronic component of claim 11 wherein the standoff is configured as a strip.

13. The electronic component of claim 12 wherein the strip fully extends across the capacitor.

14. The electronic component of claim 11 wherein the standoff is configured as a dot.

15. The electronic component of claim 11 wherein the standoff is configured as a partial dot.

16. The electronic component of claim 11 wherein the capacitor is packaged in a standard 0402 size having a length of about 0.04 inches (1.02 mm) and a width of about 0.02 inches (0.51 mm).

17. The electronic component of claim 11 wherein the standoff is between 100 and 400 μm wide.

18. The electronic component of claim 11 wherein the standoff is between 50 and 200 μm thick.

19. The electronic component of claim 11 wherein the first bottom electrode termination comprises a first solder ball and the second bottom electrode termination comprises a second solder ball.

20. The electronic component of claim 11 wherein the substrate is a semiconductor substrate.

21. The electronic component of claim 11 wherein the electronic component is a capacitor.

22. The electronic component of claim 11 wherein the first bottom electrode termination and the second bottom electrode termination being formed by screen printing.

* * * * *